United States Patent
Trinh et al.

(10) Patent No.: US 12,334,317 B2
(45) Date of Patent: Jun. 17, 2025

(54) REMOTE PLASMA ULTRAVIOLET ENHANCED DEPOSITION

(71) Applicant: Taiwan Semiconductor Manufacturing Company, Ltd., Hsinchu (TW)

(72) Inventors: Hai-Dang Trinh, Hsinchu (TW); Hsun-Chung Kuang, Hsinchu (TW); Fa-Shen Jiang, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 592 days.

(21) Appl. No.: 17/389,263

(22) Filed: Jul. 29, 2021

(65) Prior Publication Data

US 2022/0328292 A1    Oct. 13, 2022

Related U.S. Application Data

(60) Provisional application No. 63/173,132, filed on Apr. 9, 2021.

(51) Int. Cl.
| | | |
|---|---|---|
| *H01J 37/32* | (2006.01) | |
| *C23C 16/455* | (2006.01) | |
| *H01L 21/02* | (2006.01) | |

(52) U.S. Cl.
CPC .. *H01J 37/32816* (2013.01); *C23C 16/45542* (2013.01); *H01J 37/32119* (2013.01); *H01J 37/32449* (2013.01); *H01J 37/32715* (2013.01); *H01L 21/02274* (2013.01); *H01L 21/02277* (2013.01); *H01L 21/0228* (2013.01); *H01J 2237/1825* (2013.01); *H01J 2237/2007* (2013.01); *H01J 2237/332* (2013.01)

(58) Field of Classification Search
CPC .......... H01J 37/32816; H01J 37/32119; H01J 37/32449; H01J 37/32715; H01J 2237/1825; H01J 2237/2007; H01J 2237/332; C23C 16/45542; H01L 21/02274; H01L 21/02277; H01L 21/0228
See application file for complete search history.

(56) References Cited

U.S. PATENT DOCUMENTS

| | | | |
|---|---|---|---|
| 6,269,765 B1* | 8/2001 | Chu ........................ | C23C 14/48 118/723 MP |
| 2013/0252404 A1* | 9/2013 | Krishnan .......... | H01L 21/68792 118/712 |
| 2014/0227861 A1* | 8/2014 | Wu .................... | H01L 21/02274 438/468 |

(Continued)

*Primary Examiner* — Shaun M Campbell
(74) *Attorney, Agent, or Firm* — KILPATRICK TOWNSEND & STOCKTON LLP

(57) ABSTRACT

A method of depositing a layer on a semiconductor workpiece is disclosed. The method includes placing the semiconductor workpiece on a wafer chuck in a processing chamber, introducing a first precursor into the processing chamber, introducing a second precursor into the processing chamber, and while the second precursor is in the processing chamber, applying radiation to the semiconductor workpiece, whereby a surface of the semiconductor workpiece is heated. The method also includes, while the second precursor is in the processing chamber, applying a voltage bias to the wafer chuck.

20 Claims, 8 Drawing Sheets

(56) References Cited

U.S. PATENT DOCUMENTS

| | | | |
|---|---|---|---|
| 2014/0263180 A1* | 9/2014 | Moffatt | H01L 31/1812 216/62 |
| 2021/0313189 A1* | 10/2021 | Hurley | H01L 21/02356 |
| 2022/0195601 A1* | 6/2022 | Yang | C23C 16/4584 |
| 2023/0203661 A1* | 6/2023 | Oh | H01J 37/32724 427/569 |

* cited by examiner

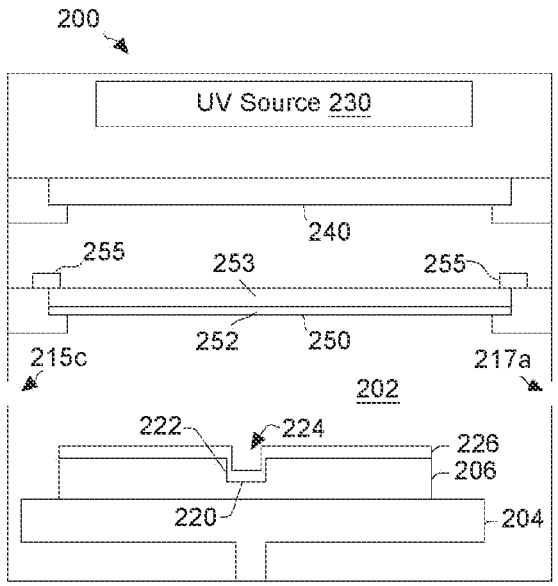 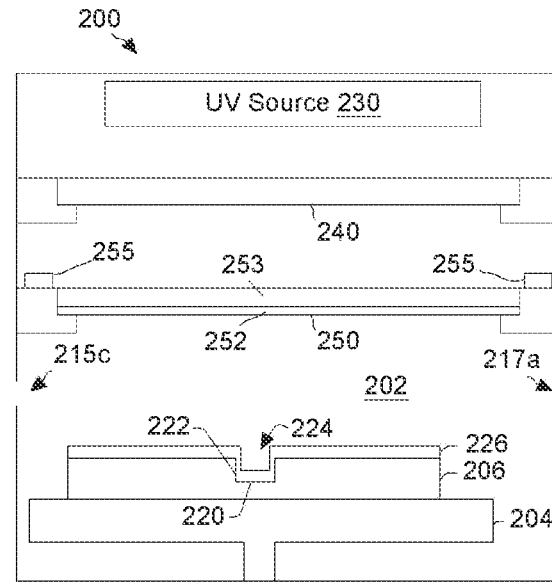
Figure 7A      Figure 7B
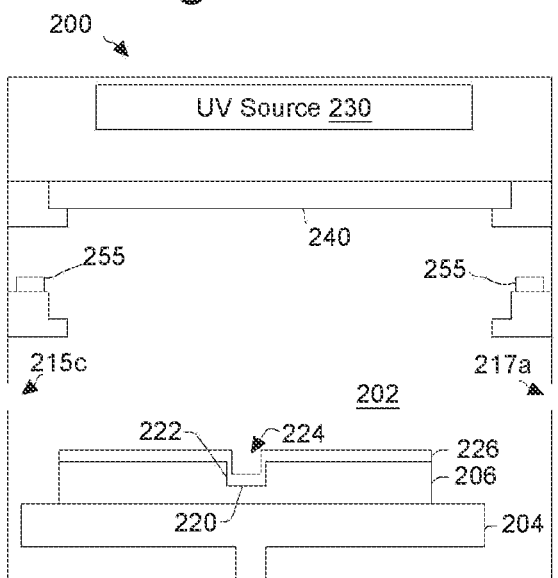 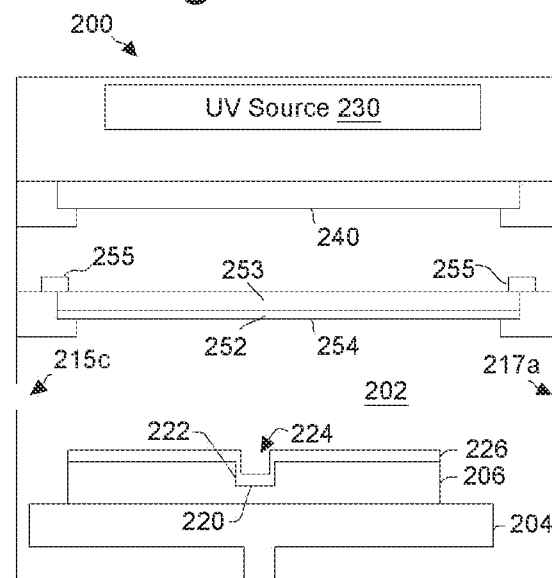
Figure 7C      Figure 7D

REMOTE PLASMA ULTRAVIOLET ENHANCED DEPOSITION

TECHNICAL FIELD

The subject matter described herein relates to semiconductor layer deposition methods, and more particularly to semiconductor layer deposition methods which use plasma and ultraviolet workpiece heating.

BACKGROUND

Semiconductor manufacturing processes include numerous fabrication steps or processes, each of which contributes to the formation of one or more semiconductor layers. Each layer may be formed, for example, by doping sections of a crystalline semiconductor substrate. In addition, one or more layers may be formed by adding or depositing, for example, conductive, resistive, and/or insulative layers on the crystalline semiconductor substrate.

DESCRIPTION OF DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 7A-7D illustrate a deposition system at various stages in a process of automatically replacing a radiation transparent window according to some embodiments.

When practical, similar reference numbers denote similar structures, features, or elements.

DETAILED DESCRIPTION

Figure 1:
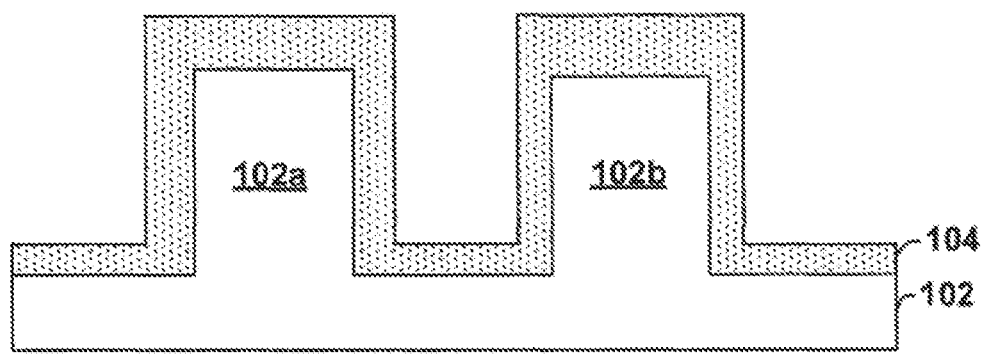
FIG. 1 illustrates a cross-sectional view of a substrate having a deposited layer according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Several illustrative embodiments will now be described with respect to the accompanying drawings, which form a part hereof. The ensuing description provides embodiment(s) only and is not intended to limit the scope, applicability, or configuration of the disclosure. Rather, the ensuing description of the embodiment(s) will provide those skilled in the art with an enabling description for implementing one or more embodiments. It is understood that various changes may be made in the function and arrangement of elements without departing from the spirit and scope of this disclosure. In the following description, for the purposes of explanation, specific details are set forth in order to provide a thorough understanding of certain inventive embodiments. However, it will be apparent that various embodiments may be practiced without these specific details. The figures and description are not intended to be restrictive. The word "example" or "exemplary" is used herein to mean "serving as an example, instance, or illustration." Any embodiment or design described herein as "exemplary" or "example" is not necessarily to be construed as preferred or advantageous over other embodiments or designs.

Typically, a number of different deposition processes may be used during fabrication of an integrated chip on a semiconductor workpiece. For example, FIG. 1 illustrates a cross-sectional view 100 of a semiconductor substrate upon which a layer 104 is formed by a deposition process on a semiconductor substrate 102 having a plurality of steps, such as step 102a and step 102b shown. Typical deposition processes are expensive at least because layer growth rate may be slow. In addition, layers formed in the typical deposition processes may have less than desired density. It is difficult to improve conventional deposition processes because high temperatures may damage some features previously formed on the semiconductor workpiece.

A motivation for the present disclosure it to enable film deposition at a low temperature. In some embodiments, low deposition temperature is applied to depositing of atomic layer deposition (ALD) oxide with thick film (ALD film herein). In those embodiments, high ALD film growth rate is still achieved with the low temperature.

Embodiments of deposition systems and deposition methods discussed herein provide various aspects and features which allow for quicker layer growth rate and high density layer formation at temperatures low enough to not damage features previously formed on the semiconductor workpiece. Characteristics of various embodiments which contribute to these benefits include one or more of: use of plasma during deposition, use of an electric field during deposition, and use of photo heating during deposition. Characteristics of the embodiments of deposition chambers which contribute to these benefits may include a window through which radiation (e.g. UV radiation) heats the semiconductor workpiece. The window may include a transparent electrode which is used to generate the electric field during deposition. Characteristics of the embodiments of deposition chambers which contribute to these benefits may also include a robotic mechanism which can replace the window without breaking the vacuum in the deposition chamber.

Figure 2:
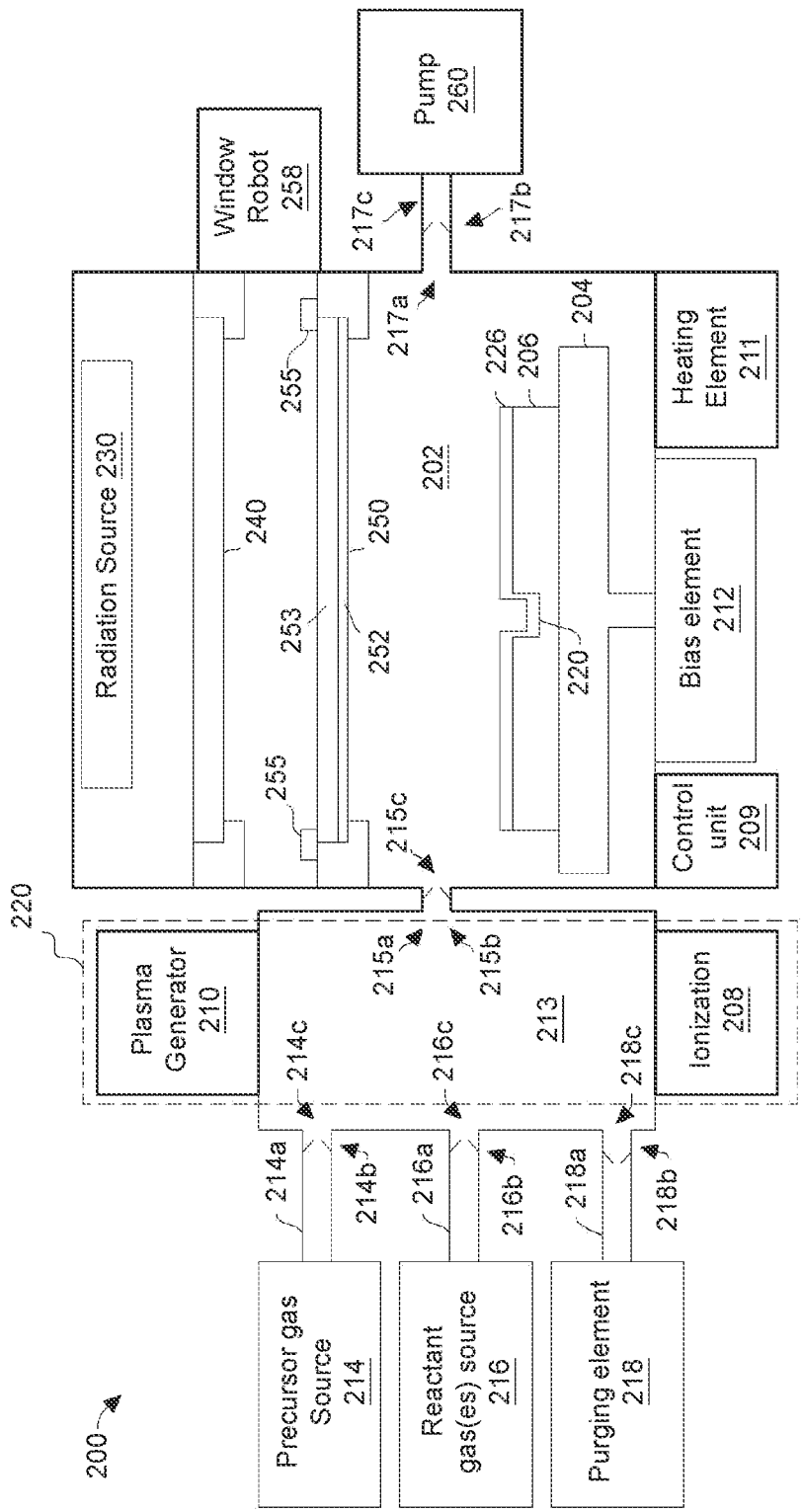
FIG. 2 illustrates a block diagram of a deposition system according to some embodiments.

FIG. 2 illustrates a block diagram of a deposition system 200 according to some embodiments. Deposition system 200 may be used to perform a deposition process to deposit layer 104.

Deposition system 200 includes control unit 209, which is communicatively coupled with other components of deposition system 200. In some embodiments, control unit 209 comprises a memory, a communication module, and a processor configured to execute instructions stored in the memory, where, when executed, the instructions cause deposition system 202 perform the actions described herein, which, for example, cause the other components of deposition system 200 to perform the actions described herein which are attributed thereto.

The deposition system 200 comprises a processing chamber 202 configured to house a semiconductor workpiece 206 (e.g., a silicon substrate). In some embodiments, the processing chamber 202 comprises a wafer chuck 204 configured to hold the semiconductor workpiece 206.

In the illustrated embodiment, an ionizing component 220 is in communication with the processing chamber 202. The ionizing component 220 is configured to selectively ionize and/or ignite gas molecules as a plasma within the processing chamber 202. In some embodiments, the ionizing component 220 selectively operates to ionize and/or ignite precursor gas molecules as a plasma and/or reactant gas molecules within an ionizing chamber 213 prior to the precursor gas molecules and/or reactant gas molecules entering the processing chamber 202. The precursor gas (ionized or not, as a plasma or not) is passed to processing chamber 202 through first conduit 215a through precursor gas inlet 215c, based upon operation of a first valve 215b, as controlled by one or more signals from control unit 209. In some embodiments, the ionizing component 220 selectively operates in response to one or more signals from control unit 209.

In some embodiments, the ionizing component 220 comprises an ionization element 208 configured to selectively ionize neutral molecules of a precursor gas within the ionizing chamber 213 by adding or removing a charged particle (e.g., an electron) to/from neutral gas molecules. The ionizing component 220 may ionize precursor gas molecules according to a variety of ways. In some embodiments, the ionization element 208 is configured to generate an electric field within the ionizing chamber 213. The electric field operates to ionize molecules of the precursor gas within the ionizing chamber 213 to generate a plasma comprising a plurality of ionized molecules. In some other embodiments, the ionization element 208 comprises an irradiant unit configured to generate an ionizing radiation that ionizes precursor gas molecules. In some embodiments, the ionization element 208 selectively operates in response to one or more signals from control unit 209.

In some embodiments, the ionizing component 220 further comprises a plasma generator 210 configured to ignite a plasma from a precursor gas to trigger a reaction between precursor gas molecules that have been previously deposited onto the semiconductor workpiece 206 and another precursor gas. The reaction forms an anisotropic deposited layer 226 on the semiconductor workpiece 206. In some embodiments, the plasma generator 210 may comprise a radio frequency (RF) powered inductively coupled plasma source configured to generate an RF plasma within the ionizing chamber 213. In various embodiments, the plasma generator 210 may be configured to ignite a direct plasma within the ionizing chamber 213 or to ignite an indirect plasma at a location remote from the ionizing chamber 213, as illustrated. In some embodiments, the plasma generator 210 selectively operates in response to one or more signals from control unit 209.

A precursor gas source 214 is coupled to the ionizing chamber 213 by way of second conduit 214a. The second conduit 214a may be configured to selectively provide a first precursor gas to a second precursor gas inlet 214c in the ionizing chamber 213, based upon operation of a second valve 214b. In some embodiments, the first precursor gas is ionized in ionizing chamber 213. In some embodiments, a plasma is ignited in ionizing chamber 213 with the first precursor gas therein. The first precursor gas (ionized or not, as a plasma or not) is passed to processing chamber 202 through first conduit 215a through first precursor gas inlet 215c, based upon operation of a first valve 215b, as controlled by one or more signals from control unit 209.

A reactant gas source 216 is coupled to the ionizing chamber 213 by way of a third conduit 216a. The third conduit 216a may be configured to selectively provide a reactant gas as a second precursor gas to a reactant gas inlet 216c in the ionizing chamber 213, based upon operation of a third valve 216b. In some embodiments, the second precursor gas is ionized in ionizing chamber 213. In some embodiments, a plasma is ignited in ionizing chamber 213 with the second precursor gas therein. The second precursor gas (ionized or not, as a plasma or not) is passed to processing chamber 202 through first conduit 215a through first precursor gas inlet 215c, based upon operation of a first valve 215b, as controlled by one or more signals from control unit 209.

In some embodiments, the Deposition system 200 further comprises a purging element 218 configured to purge the ionizing chamber 213 and the processing chamber 202. The purging element 218 may be connected to the ionizing chamber 213 by way of a fourth conduit 218a comprising a fourth valve 218b. The fourth conduit 218a is configured to introduce a purging gas to the ionizing chamber 213 and the processing chamber 202 by way of a purging inlet 218c. The purging gas evacuates other gases from the ionizing chamber 213 and the processing chamber 202. For example, the purging element 218 may purge one or more precursor gases from the ionizing chamber 213 and the processing chamber 202, as controlled by one or more signals from control unit 209.

It will be appreciated that the term 'valve', as provided herein, is not limited to a particular physical or mechanical structure but rather refers to any element that controls the flow of gas to the processing chamber 202.

A heating element 211 is connected to the wafer chuck 204. The heating element 211 is configured to selectively cause processing chamber 202 and/or the workpiece 206 to maintain a particular temperature at least by causing the wafer chuck 204 to maintain the particular temperature. The particular temperature is lower than what would damage features previously formed on the semiconductor workpiece 206. In addition, particular temperature may be lower than that which would be desired for deposition operations. For example, the particular temperature may be less than about 50 C, about 100 C, about 150 C, about 200 C, about 250 C, about 300 C, about 350 C, about 400 C, or about 450 C.

Processing chamber 202 also includes photo-heating radiation source 230, radiation transparent plate 240, and radiation transparent window 250, which are collectively configured to irradiate semiconductor workpiece 206 so as to temporarily heat the surface of the semiconductor workpiece 206.

Photo-heating radiation source 230 may include, for example a ultraviolet (UV) radiation source, such as a UV lamp. Other radiation sources may also be used. In some embodiments, power density (W/cm2) of the radiation source 230 may be greater than about 500 mW/cm2, about 1000 W/cm2, about 2000 W/cm2, about 3000 W/cm2, about 4000 W/cm2, about 5000 W/cm2, or more. In some embodiments, the wavelength of the radiation of the radiation source may be about 100 nm, about 150 nm, about 200 nm, about 250 nm, about 300 nm, about 350 nm, about 400 nm, about 450 nm, about 500 nm, about 550 nm, or more than 550 nm.

Radiation transparent plate 240 may be transparent or substantially transparent to the wavelength bandwidth emitted by photo-heating radiation source 230. In some embodiments, radiation transparent plate 240 comprises quartz. For example, in some embodiments, radiation transparent plate 240 comprises crystalline quartz. Other types of radiation transparent plates 240 may be used. In some embodiments, radiation transparent plate 240 provides a hermetic, substantially hermetic, or about hermetic barrier between the spaces above and below radiation transparent plate 240, as illustrated in FIG. 2.

Radiation transparent window 250 may be transparent or substantially transparent to the wavelength bandwidth emitted by photo-heating radiation source 230 and is held in place by clamping mechanisms 255. In some embodiments, radiation transparent window 250 comprises a first transparent portion 253 and a second transparent portion 252. First transparent portion 253 may, for example, comprise glass or another transparent nonconductive material. Second transparent portion 252 may, for example, comprise a transparent conductive material, such as ITO, $SrVO_3$, $CaVO_3$, or another conductive material transparent or substantially transparent to the wavelength bandwidth emitted by photo-heating radiation source 230. In some embodiments, radiation transparent window 250 provides a hermetic, substantially hermetic, or about hermetic barrier between the spaces above and below radiation transparent window 250, as illustrated in FIG. 2.

Clamping mechanisms 255 are operatively connected to and controlled by window robot 258, which is configured to replace a used radiation transparent window 250 with a new radiation transparent window 254 (not shown). Window robot 258 comprises features and mechanical systems which are similar or identical to those used by robotic mechanisms which are used to manipulate semiconductor wafers, and which are known to those of skill in the art. In some embodiments, window robot 250 includes features and mechanical systems which are modified using techniques known to those of skill in the art. In some embodiments, the window robot 258 selectively operates in response to one or more signals from control unit 209.

A bias element 212 is electrically connected to the wafer chuck 204. The bias element 212 may be configured to selectively apply a bias voltage to the semiconductor workpiece 206 by applying the bias voltage to wafer chuck 204. In some embodiments, the bias element 212 is configured to apply a pulsed bias voltage that varies between a first voltage value and a second voltage value as a function of time. For example, in some embodiments, the bias element 212 is configured to apply a bias voltage, having a value in the range of between approximately −200 V and approximately +200 V to the semiconductor workpiece 206 through wafer chuck 204. By operating the bias element 212, ionized molecules of a precursor gas are attracted to semiconductor workpiece 206 with a downward force in the direction of the semiconductor workpiece 206. The downward force, in addition to diffusion-absorption, causes an anisotropic deposition of precursor gas molecules onto the semiconductor workpiece 206 that allows formation of the anisotropic deposited layer 226.

In some embodiments, bias element 212 is electrically connected to the second transparent portion 252 of radiation transparent window 250. The bias element 212 may be configured to selectively apply a bias voltage to the second transparent portion 252 of radiation transparent window 250 by applying the bias voltage to the second transparent portion 252. In some embodiments, the bias element 212 is configured to apply a pulsed bias voltage that varies between a first voltage value and a second voltage value as a function of time. For example, in some embodiments, the bias element 212 is configured to apply a bias voltage, having a value in the range of between approximately −200 V and approximately +200 V to the second transparent portion 252. By operating the bias element 212, ionized molecules of the precursor gas are repelled from radiation transparent window 250 with a downward force in the direction of the semiconductor workpiece 206. The downward force, in addition to causing deposition of the precursor gas molecules onto the semiconductor workpiece 206, also reduces or eliminates accumulation of the molecules of the precursor gas on transparent window 250 during formation of the anisotropic deposited layer 226.

It will be appreciated that the disclosed deposition system 200 is not limited to forming a deposited layer 226 having a single monolayer. Rather, the disclosed deposition system 200 may form a deposited layer 226 comprising multiple layers. For example, the disclosed deposition system 200 may form a deposited layer 226 that is multiple atoms thick on the top and bottom surfaces, while it forms a thinner deposited layer (e.g., a deposited layer 226 a single atom thick) on the sidewalls of a step.

Deposition system 200 may, for example, form layers using an atomic layer deposition (ALD) process, which includes, for example, a layer-by-layer process for the deposition of films. For example, an ALD process may a precursor gas and a reactant gas to deposit a film on a substrate housed within a processing chamber. In some embodiments, a first precursor gas may be used to deposit precursor molecules onto the substrate, after which a reactant (or second precursor) gas may be brought into contact with precursor molecules on the substrate. In some embodiments, heat within the processing chamber causes the reactant gas to react with the first precursor molecules to form a film on the substrate.

Deposition system 200 may, for example, form layers using a plasma enhanced ALD, or PEALD process, which includes, for example, a deposition process that can be used to provide higher throughput and other benefits over stand ALD processes. PEALD processes may make use of precursor and reactant gases that react with each other as a result of plasma activation).

Deposition system 200 may, for example, form layers using a physical vapor deposition (PVD) process, which includes, for example, a physical process that deposits thin films onto a substrate by vaporizing a material, transporting the vaporized material to the substrate, and condensing the material on the substrate to form a film or layer.

Deposition system 200 may, for example, form layers using a plasma enhanced PVD, or PEPVD, which includes, for example, a deposition process that can be used to provide higher throughput and other benefits over stand PVD processes. PEPVD processes may make use of precursor and reactant gases that react with each other as a result of plasma activation).

Deposition system 200 may, for example, form layers using a chemical vapor deposition (CVD) process, which includes, for example, a chemical process that deposits thin films onto a substrate by exposing the substrate to one or more volatile precursors, which react and/or decompose on the substrate surface to produce the desired film or layer.

Deposition system 200 may, for example, form layers using a plasma enhanced CVD, or PECVD process, which includes, for example, a deposition process that can be used to provide higher throughput and other benefits over stand CVD processes. PECVD processes may make use of precursor and reactant gases that react with each other as a result of plasma activation).

Deposition system 200 may, for example, form layers using another deposition process.

Figure 3:
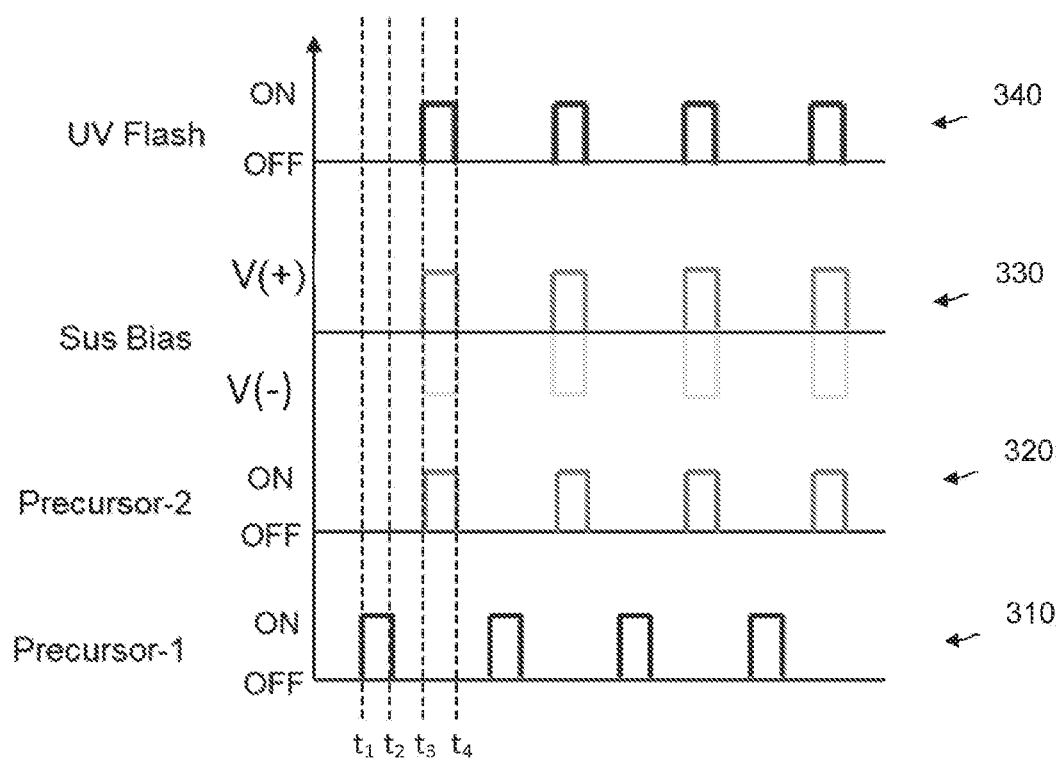
FIGS. 3-6 show timing diagrams illustrating exemplary operations of a deposition system according to some embodiments.

FIG. 3 illustrates timing diagrams 310-340 illustrating an exemplary operation of the deposition system 200 by control unit 209.

As shown in timing diagram 310, at a first time t1 the control unit 209 operates to introduce a first precursor gas into the processing chamber 202 through ionizing chamber 213 by way of the second precursor gas inlet 214c. The control unit 209 causes the first precursor gas to flow into the processing chamber 202 through ionizing chamber 213 from the first time t1 to a second time t2. In some embodiments, control unit 209 causes the first precursor gas flowing into processing chamber 202 to have been ionized or ignited as a plasma by ionizing chamber 213.

In some embodiments, at second time t2 the control unit 209 operates to introduce a purge gas into the processing chamber 202 through ionizing chamber 213 by way of the purging gas inlet 218c. The control unit 209 causes the purge gas to flow into the processing chamber 202 through ionizing chamber 213 from the second time t2 to a third time t3. The purge gas flowing into ionizing chamber 213 and processing chamber 202 substantially removes the first precursor gas from ionizing chamber 213 and processing chamber 202.

As shown in timing diagram 320, at a third time t3 the control unit 209 operates to introduce a second precursor gas into the processing chamber 202 through ionizing chamber 213 by way of the third precursor gas inlet 216c. The control unit 209 causes the second precursor gas to flow into the processing chamber 202 through ionizing chamber 213 from the third time t3 to a fourth time t4. In some embodiments, control unit 209 causes the second precursor gas flowing into processing chamber 202 to have been ionized or ignited as a plasma by ionizing chamber 213.

As shown in timing diagram 330, during the time between the third time t3 and the fourth time t4, the control unit 209 further operates the bias element 212 to apply a bias voltage as a potential difference between the wafer chuck 204 and the radiation transparent window 250. In some embodiments, the bias voltage varies between a first value and a second value. The bias voltage may cause ionized or plasma precursor molecules to be attracted toward workpiece 206 previously placed on wafer chuck 204, and to be repelled from radiation transparent window 250 with a downward force. The downward force may cause more ionized precursor molecules to be deposited onto horizontal surfaces (e.g., where accumulation of particles is due to the downward force and diffusion) of the workpiece 206 than on vertical surfaces of the workpiece 206 (e.g., where accumulation of particles is due to diffusion) providing for anisotropic coverage of precursor molecules on the workpiece 206.

As shown in timing diagram 340, during the time between the third time t3 and the fourth time t4, the control unit 209 further operates the photo-heating radiation source 230 to apply radiation through radiation transparent plate 240 and radiation transparent window 250 to semiconductor workpiece 206. The applied radiation increases the temperature of at least the surface of the semiconductor workpiece 206 above the temperature of the semiconductor workpiece 206 caused by heating element 211. For example, the temperature of the surface of the semiconductor workpiece 206 may increase to about 150 C, about 200 C, about 250 C, about 300 C, about 350 C, about 400 C, or about 450 C. In some embodiments, the temperature of the surface of the semiconductor workpiece 206 increases beyond that which would damage features previously formed on the semiconductor workpiece 206. However, the temperature of the features previously formed on the semiconductor workpiece 206 stays below that which would damage them.

Because the surface of the semiconductor workpiece 206 is heated, the benefits of higher temperatures for deposition are achieved. Because the temperatures of the features previously formed on the semiconductor workpiece 206 remain below that which would cause damage, the previously formed features are not harmed. Accordingly, deposition system 200 has the advantageous benefits of higher deposition temperatures without the cost of damaging previously formed features. These advantageous benefits include at least increased layer growth rate and decreased layer formation time.

Because the surface of the semiconductor workpiece 206 is heated while the layer is formed under the influence of the bias voltage, the formed layer has increased density. In addition, deposition system 200 advantageously allows for improved control of deposition time and deposited layer characteristics by allowing for independent control of surface temperature, for example, by controlling either or both of the output power and output time of the photo-heating radiation source 230, and the bias voltage. Furthermore, the bias voltage causes the ions to have direction of movement and velocity which results in improved filling of gaps, and results in improved density. In addition, because the semiconductor workpiece 206 is heated by the radiation of the radiation source 230, the chemical and other reactions occurring at the semiconductor workpiece 206 occur more rapidly and more efficiently.

In some embodiments, at fourth time t4 the control unit 209 operates to introduce a purge gas into the processing chamber 202 through ionizing chamber 213 by way of the purging gas inlet 218c. The control unit 209 causes the purge gas to flow into the processing chamber 202 through ionizing chamber 213 from the fourth time t4 to another time. The purge gas flowing into ionizing chamber 213 and processing chamber 202 substantially removes the first precursor gas from ionizing chamber 213 and processing chamber 202.

It will be appreciated that the first and second precursor gases may be chosen based upon a material to be deposited. In various embodiments, the deposited layer may comprise an oxide (e.g., $SiO_2$, $HfO_2$, $Al_2O_3$, etc.) or a metal (e.g., Al, TiN, TaN, etc.). For example, to form deposited layer comprising a $SiO_2$ oxide, a silicon first precursor (e.g., tetradimethyl-aminosilicon) and an oxide reactant gas as a second precursor may be used. Similarly, to form a deposited layer comprising $HfO_2$ a hafnium first precursor (e.g., tetrakis(ethylmethylamino)hafnium) and a oxygen reactant gas as a second precursor may be used. Further, to form a deposited layer comprising aluminum, a first precursor (e.g., TMA or TEA) and a oxygen reactant gas as a second precursor may be used. In some embodiments, at least one of $TiCl_4$ and another precursor may be used as a first precursor. In some embodiments, at least one of O2, HN3, N2, H2, and another precursor may be used as a second precursor.

It will be appreciated that, after fourth time t4, one or more or all portions of the deposition cycle process described above may be repeated, as illustrated. In some embodiments, because of the advantageous aspects of deposition system 200, the time between successive first times t1, where a first precursor gas is introduced processing chamber 202 is less than about 2 s, about 3 s, about 4 s, about 5 s, about 6 s, about 7 s, about 8 s, about 9 s, or about 10 s. In some embodiments, because of the advantageous aspects of deposition system 200, the time between first time t1 and second time t2, is less than about 0.5 s, about 1 s, about 1.5 s, about 2 s, or about 2.5 s. In some embodiments, because of the advantageous aspects of deposition system 200, the time between third time t3 and fourth time t4, is less than about 0.5 s, about 1 s, about 1.5 s, about 2 s, or about 2.5 s.

Figure 4:
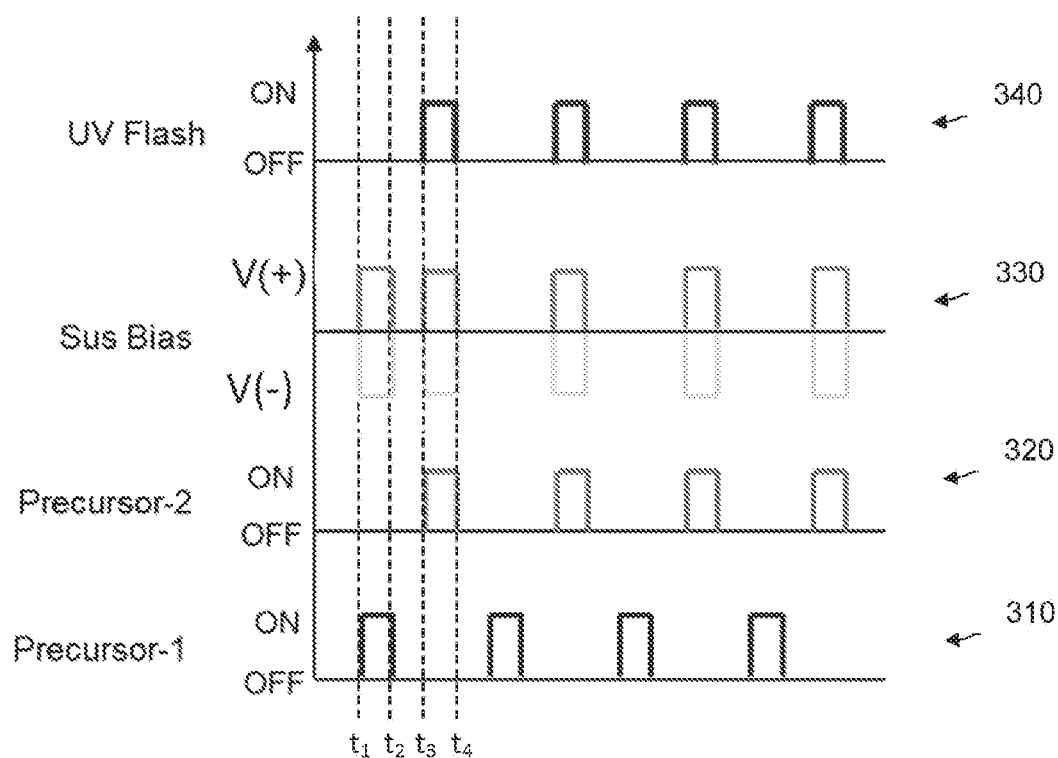

As shown in FIG. 4, in some embodiments, as shown in timing diagram 330, during the time between the first time t1 and the second time t2, the control unit 209 further operates the bias element 212 to apply a bias voltage as a potential difference between the wafer chuck 204 and the radiation transparent window 250. In some embodiments, the bias voltage varies between a first value and a second value. The bias voltage may cause ionized or plasma precursor molecules to be attracted toward the workpiece 206 and repelled from radiation transparent window 250 with a downward force. The downward force may cause more ionized precursor molecules to be deposited onto horizontal surfaces (e.g., where accumulation of particles is due to the downward force and diffusion) of the workpiece 206 than on vertical surfaces of the workpiece 206 (e.g., where accumulation of particles is due to diffusion) providing for anisotropic coverage of precursor molecules on the workpiece 206. In some embodiments, the bias voltage applied during the time between the first time t1 and the second time t2 is different from the bias voltage applied during the time between the third time t3 and the fourth time t4.

Figure 5:
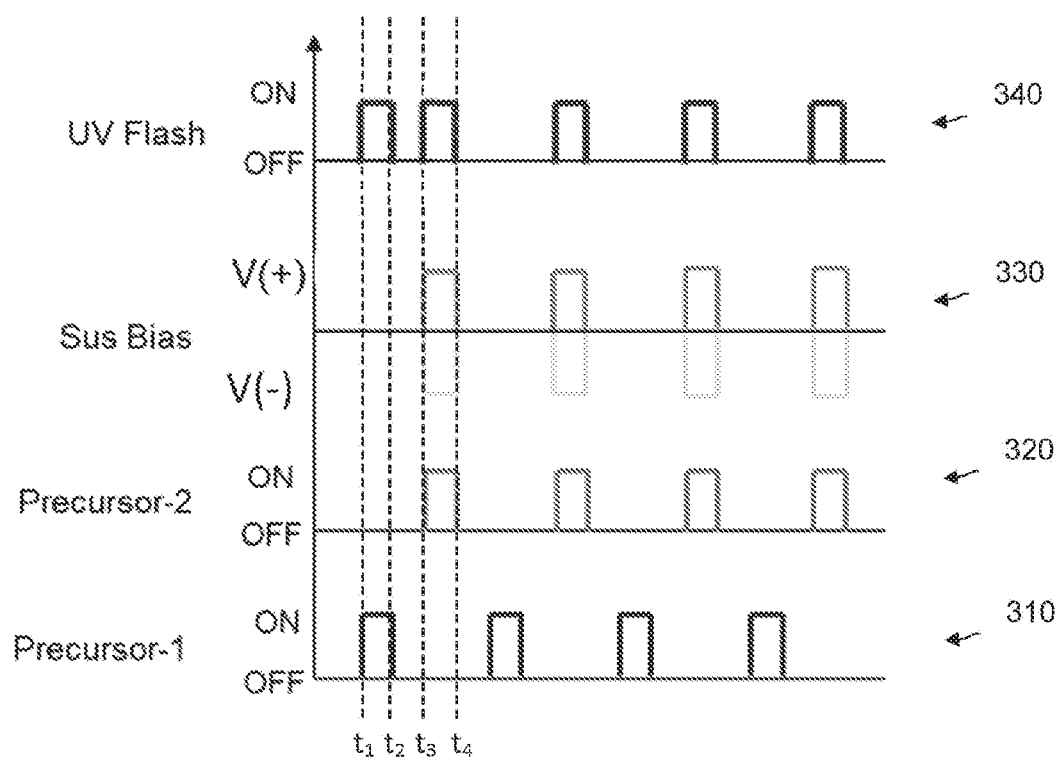

As shown in FIG. 5, in some embodiments, as shown in timing diagram 340, during the time between the first time t1 and the second time t2, the control unit 209 further operates the photo-heating radiation source 230 to apply radiation through radiation transparent plate 240 and radiation transparent window 250 to semiconductor workpiece 206. The applied radiation increases the temperature of at least the surface of the semiconductor workpiece 206 above the temperature of the semiconductor workpiece 206 caused by heating element 211. For example, the temperature of the surface of the semiconductor workpiece 206 may increase to about 150 C, about 200 C, about 250 C, about 300 C, about 350 C, about 400 C, or about 450 C. In some embodiments, the temperature of the surface of the semiconductor workpiece 206 increases beyond that which would damage features previously formed on the semiconductor workpiece 206. However, the temperature of the features previously formed on the semiconductor workpiece 206 stays below that which would damage them. In some embodiments, the temperature of the semiconductor workpiece 206 induced during the time between the first time t1 and the second time t2 is different from the temperature of the semiconductor workpiece 206 induced during the time between the third time t3 and the fourth time t4.

Figure 6:
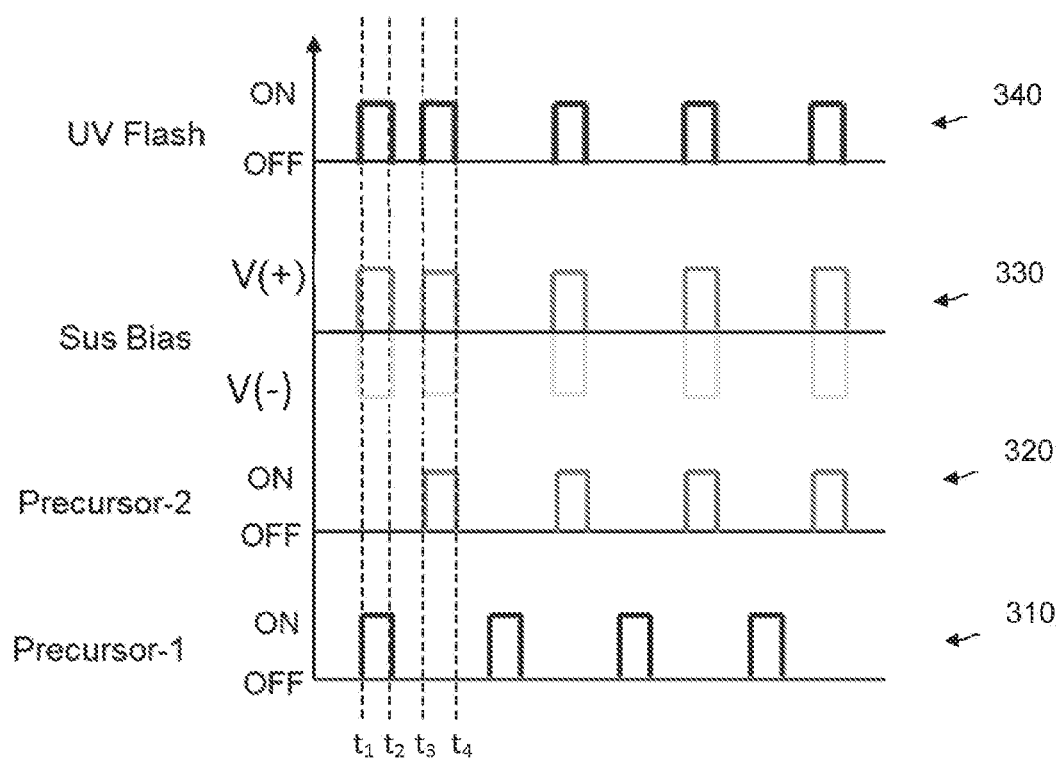

As shown in FIG. 6, in some embodiments, as shown in timing diagrams 330 and 350, during the time between the first time t1 and the second time t2, the control unit 209 further operates the bias element 212 to apply a bias voltage as a potential difference between the wafer chuck 204 and the radiation transparent window 250, and the control unit 209 further operates the photo-heating radiation source 230 to apply radiation through radiation transparent plate 240 and radiation transparent window 250 to semiconductor workpiece 206.

In some embodiments, the applied bias voltage varies between a first value and a second value. The bias voltage may cause ionized or plasma precursor molecules to be attracted toward the workpiece 206 and repelled from radiation transparent window 250 with a downward force. The downward force may cause more ionized precursor molecules to be deposited onto horizontal surfaces (e.g., where accumulation of particles is due to the downward force and diffusion) of the workpiece 206 than on vertical surfaces of the workpiece 206 (e.g., where accumulation of particles is due to diffusion) providing for anisotropic coverage of precursor molecules on the workpiece 206. In some embodiments, the bias voltage applied during the time between the first time t1 and the second time t2 is different from the bias voltage applied during the time between the third time t3 and the fourth time t4.

The applied radiation increases the temperature of at least the surface of the semiconductor workpiece 206 above the temperature of the semiconductor workpiece 206 caused by heating element 211. For example, the temperature of the surface of the semiconductor workpiece 206 may increase to about 150 C, about 200 C, about 250 C, about 300 C, about 350 C, about 400 C, or about 450 C. In some embodiments, the temperature of the surface of the semiconductor workpiece 206 increases beyond that which would damage features previously formed on the semiconductor workpiece 206. However, the temperature of the features previously formed on the semiconductor workpiece 206 stays below that which would damage them. In some embodiments, the temperature of the semiconductor workpiece 206 induced during the time between the first time t1 and the second time t2 is different from the temperature of the semiconductor workpiece 206 induced during the time between the third time t3 and the fourth time t4.

FIGS. 7A-7D illustrate deposition system 200 at various stages in a process of automatically replacing radiation transparent window 250, as illustrated in FIG. 7A. In some embodiments, the window is replaced after processing chamber 202 of deposition system 200 is used to deposit a layer and before a low pressure or vacuum generated with pump 260 is broken. In some embodiments, to replace radiation transparent window 250, in response to one or more signals from control unit 209, window robot 258 is configured to actuate clamping mechanisms 255 so as to release radiation transparent window 250, as shown in FIG. 7B. In those embodiments, the robot 258 is configured to remove radiation transparent window 250, as shown in FIG. 7C and to place removed radiation transparent window 250 in a location specified for used windows. In those embodiments, the robot 258 is configured to retrieve new radiation transparent window 254 (not shown) for my location specified for new windows, place new radiation transparent window 254 in the indicated location shown as being occupied by radiation transparent window 250 in FIG. 2, as shown in FIG. 7D, and actuate clamping mechanisms 255 so as to attach, fix, or secure new radiation transparent window 254 in the indicated location, as shown in FIG. 7D.

In some embodiments, at least a portion of window robot 258 is positioned within the hermetic environment of processing chamber 202. In some embodiments, the location specified for used windows is positioned within the hermetic environment of processing chamber 202. In some embodiments, the location specified for new windows is positioned within the hermetic environment of processing chamber 202. Accordingly, in some embodiments, the old radiation transparent window 250 may be replaced with a new radiation transparent window 254 after pump 260 reduces the pressure with processing chamber 202 and without breaking the vacuum of the processing chamber 202. In some embodiments, another deposition cycle process, as described above, may be initiated or even completed without breaking the vacuum of the processing chamber 202 after the old radiation transparent window 250 has been replaced with a new radiation transparent window 254.

Figure 8:
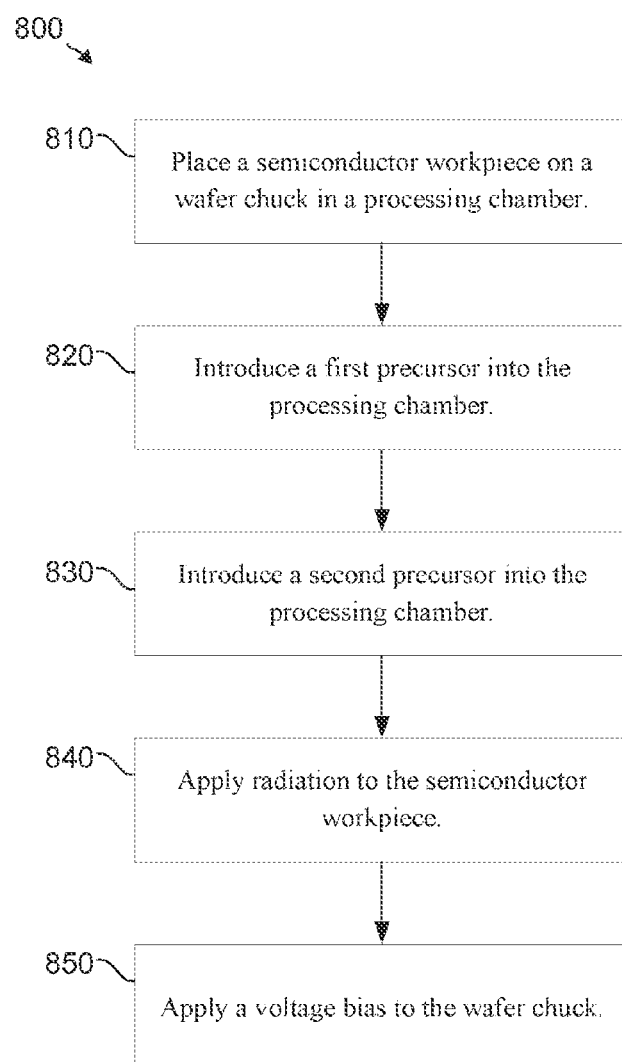
FIG. 8 is a flowchart illustrating a method of depositing a layer on a semiconductor workpiece.

FIG. 8 is a flowchart illustrating a method 800 of depositing a layer on a semiconductor workpiece. The method 800 may be performed, for example, using the deposition system 200 illustrated in FIG. 2.

At 810, a semiconductor workpiece, such as semiconductor workpiece 206 of deposition system 200, is placed on a wafer chuck, such as wafer chuck 204 of deposition system 200, in a processing chamber, such as processing chamber 202 of deposition system 200. For example, a robotic mechanism may place the semiconductor workpiece on the wafer chuck in response to one or more signals from a controller of a deposition system, such as control unit 209 of deposition system 200.

At 820, a first precursor is introduced into the processing chamber. For example, in response to one or more signals from the controller of the deposition system, a valve, such as second valve 214b of deposition system 200 may open to connect the processing chamber to a source of the first precursor, such as precursor gas source 214 of deposition system 200. In some embodiments, the first precursor is ionized and ignited to generate a plasma before or after being introduced into the processing chamber. In some embodiments, the first precursor is not ionized and ignited to generate a plasma.

At 830, a second precursor is introduced into the processing chamber. For example, in response to one or more signals from the controller of the deposition system, a valve, such as third valve 216b of deposition system 200 may open to connect the processing chamber to a source of the second precursor, such as reactant gas source 216 of deposition system 200. In some embodiments, the second precursor is ionized and ignited to generate a plasma before or after being introduced into the processing chamber. In some embodiments, the second precursor is not ionized and ignited to generate a plasma.

At 840, radiation is applied to the semiconductor workpiece. For example, radiation may be transmitted to the semiconductor workpiece from a radiation source, such as photo-heating radiation source 230 of deposition system 200, through a window, such as radiation transparent window 250 of deposition system 200 in response to one or more signals from the controller of the deposition system.

At 850, a voltage bias is applied to the wafer chuck. For example, in response to one or more signals from the controller of the deposition system, a bias element, such as bias element 212 of deposition system 200, may apply a voltage bias to the wafer chuck. In some embodiments, the applied voltage bias causes at least a portion of either or both of the first and second precursors to accumulate on the semiconductor workpiece. In some embodiments, the voltage bias causes at least a portion of either or both of the first and second precursors to accelerate toward the semiconductor workpiece and away from the window. In some embodiments, the voltage bias causes a potential difference between the wafer chuck and the window.

In some embodiments, method 800 also includes reducing a pressure within the processing chamber, for example, with a pump, such as pump 260 of deposition system 200, and replacing the window while the pressure in the processing chamber is reduced, for example, with a robotic mechanism. In some embodiments, method 800 also includes introducing another precursor into the processing chamber after the window is replaced and with the pressure within the processing chamber still reduced.

Typical deposition processes are expensive at least because of slow layer growth rate, and generally form layers with less than desired density. It is difficult to improve growth rate and layer density with conventional deposition processes because high temperatures may damage some features previously formed on the semiconductor workpiece.

The described embodiments of deposition systems and deposition methods have advantageous aspects and features which provide quicker layer growth rate and provide high density layer formation. In addition, the advantageous layer growth performance is performed at temperatures low enough to not cause damage to features previously formed on the semiconductor workpiece. Characteristics of various embodiments which contribute to these benefits include one or more of: use of plasma during deposition, use of an electric field during deposition, and use of photo heating during deposition to increase the temperature of the layer formation surface of the semiconductor workpiece. Characteristics of the embodiments of deposition chambers which contribute to these benefits include a window through which radiation (e.g. UV radiation) heats the semiconductor workpiece. In some embodiments, the window includes a transparent electrode which is used to generate the electric field during deposition. Characteristics of the embodiments of deposition chambers which contribute to these benefits may also include a robotic mechanism which can replace the window without breaking the vacuum in the deposition chamber between successive deposition processes.

One inventive aspect is a method of depositing a layer on a semiconductor workpiece. The method includes placing the semiconductor workpiece on a wafer chuck in a processing chamber, introducing a first precursor into the processing chamber, introducing a second precursor into the processing chamber, and while the second precursor is in the processing chamber, applying radiation to the semiconductor workpiece, whereby a surface of the semiconductor workpiece is heated. The method also includes, while the second precursor is in the processing chamber, applying a voltage bias to the wafer chuck.

In some embodiments, the method also includes ionizing the second precursor, and igniting the second precursor to generate a plasma.

In some embodiments, the second precursor is introduced into the processing chamber after the plasma is ignited.

In some embodiments, the voltage bias causes at least a portion of the second precursor to accumulate on the semiconductor workpiece.

In some embodiments, the radiation is applied through a window, and the voltage bias causes at least a portion of the second precursor to accelerate away from the window.

In some embodiments, the voltage bias causes a potential difference between the wafer chuck and the window.

In some embodiments, the method also includes reducing a pressure within the processing chamber, and replacing the window while the pressure in the processing chamber is reduced.

In some embodiments, the method also includes introducing another precursor into the processing chamber after the window is replaced and with the pressure within the processing chamber still reduced.

Another inventive aspect is a deposition system. The deposition system includes a processing chamber including an inlet configured to receive at least first and second precursors, a wafer chuck in the processing chamber, where the wafer chuck is configured to receive and hold a semiconductor workpiece, a radiation source configured to transmit radiation toward the wafer chuck, and a bias element configured to apply a voltage bias to the wafer chuck.

In some embodiments, the deposition system also includes a plasma generator configured to ionize the second precursor and to ignite the second precursor to generate a plasma.

In some embodiments, the plasma generator is configured to pass the first precursor to the processing chamber through the inlet.

In some embodiments, the plasma generator is configured to pass the plasma into the processing chamber through the inlet.

In some embodiments, the radiation is transmitted toward the wafer chuck through a window, and the bias element is configured to apply the voltage bias to the wafer chuck while the plasma is in the processing chamber such that the voltage bias causes at least a portion of the plasma to accelerate away from the window.

In some embodiments, the radiation source is configured to pass the radiation toward the wafer chuck through the window while the plasma is in the processing chamber, and while the bias element applies the voltage bias to the wafer chuck.

In some embodiments, the window includes a transparent electrode configured to pass the radiation toward the wafer chuck, and the voltage bias causes a potential difference between the wafer chuck and the transparent electrode of the window.

In some embodiments, the deposition system also includes a window, where the radiation is transmitted toward the wafer chuck through the window, a pump configured to reduce a pressure within the processing chamber, and a robotic system configured to replace the window while the pressure in the processing chamber is reduced.

In some embodiments, the pump is configured to maintain the reduced pressure in the processing chamber while the window is changed and at least through a time when another precursor is introduced into the processing chamber.

Another inventive aspect is a method of replacing a window of a deposition system, where the window is configured to transmit radiation from a radiation source to a wafer chuck configured to hold a semiconductor workpiece within a processing chamber. The method includes, with a pump, reducing a pressure of the processing chamber, and, with a robotic mechanism, replacing the window while the pump maintains the reduced pressure of the processing chamber.

In some embodiments, the method also includes after the pressure of the processing chamber is reduced, and before the window is replaced, depositing a layer on the semiconductor workpiece.

In some embodiments, the method also includes introducing a precursor into the processing chamber after the window is replaced and with the pressure within the processing chamber still reduced. In the descriptions above and in the claims, phrases such as "at least one of" or "one or more of" may occur followed by a conjunctive list of elements or features. The term "and/or" may also occur in a list of two or more elements or features. Unless otherwise implicitly or explicitly contradicted by the context in which it used, such a phrase is intended to mean any of the listed elements or features individually or any of the recited elements or features in combination with any of the other recited elements or features. For example, the phrases "at least one of A and B;" "one or more of A and B;" and "A and/or B" are each intended to mean "A alone, B alone, or A and B together." A similar interpretation is also intended for lists including three or more items. For example, the phrases "at least one of A, B, and C;" "one or more of A, B, and C;" and "A, B, and/or C" are each intended to mean "A alone, B alone, C alone, A and B together, A and C together, B and C together, or A and B and C together." Use of the term "based on," above and in the claims is intended to mean, "based at least in part on," such that an unrecited feature or element is also permissible.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of depositing a layer on a semiconductor workpiece, the method comprising:
   placing the semiconductor workpiece on a wafer chuck in a processing chamber;
   heating, by a heating element, the processing chamber to a first temperature for a first time period;
   introducing a first precursor into the processing chamber;
   introducing a second precursor into the processing chamber;
   applying radiation, through a window, to a top surface of the semiconductor workpiece to heat the semiconductor workpiece to a second temperature higher than the first temperature for a second time period shorter than the first time period, the second temperature facilitating deposition of the layer on the top surface of the semiconductor workpiece;
   while the second precursor is in the processing chamber, applying a voltage bias to the wafer chuck, and wherein the voltage bias causes at least a portion of the second precursor to accelerate away from the window;
   reducing a pressure within the processing chamber; and
   replacing the window while the pressure in the processing chamber is reduced.

2. The method of claim 1, further comprising ionizing the second precursor, and igniting the second precursor to generate a plasma.

3. The method of claim 2, wherein the second precursor is introduced into the processing chamber after the plasma is ignited.

4. The method of claim 1, wherein the voltage bias causes at least a portion of the second precursor to accumulate on the semiconductor workpiece.

5. The method of claim 1, wherein the voltage bias causes a potential difference between the wafer chuck and the window.

6. The method of claim 1, further comprising introducing another precursor into the processing chamber after the window is replaced and with the pressure within the processing chamber still reduced.

7. A deposition system, comprising:
a processing chamber comprising an inlet configured to receive at least first and second precursors;
a wafer chuck in the processing chamber, wherein the wafer chuck is configured to receive and hold a semiconductor workpiece;
a heating element configured to heat the processing chamber to a first temperature for a first time period;
a radiation source configured to transmit radiation toward a top surface of the semiconductor workpiece to heat the semiconductor workpiece to a second temperature higher than the first temperature for a second time period shorter than the first time period, the second temperature facilitating deposition of a layer on the top surface of the semiconductor workpiece;
a bias element configured to apply a voltage bias to the wafer chuck;
a plasma generator configured to ionize the second precursor and to ignite the second precursor to generate a plasma;
a window, wherein the radiation is transmitted toward the wafer chuck through the window;
a pump configured to reduce a pressure within the processing chamber; and
a robotic system configured to replace the window while the pressure in the processing chamber is reduced.

8. The deposition system of claim 7, wherein the plasma generator is configured to pass the first precursor to the processing chamber through the inlet.

9. The deposition system of claim 7, wherein the plasma generator is configured to pass the plasma into the processing chamber through the inlet.

10. The deposition system of claim 7, wherein the bias element is configured to apply the voltage bias to the wafer chuck while the plasma is in the processing chamber such that the voltage bias causes at least a portion of the plasma to accelerate away from the window.

11. The deposition system of claim 10, wherein the radiation source is configured to pass the radiation toward the wafer chuck through the window while the plasma is in the processing chamber, and while the bias element applies the voltage bias to the wafer chuck.

12. The deposition system of claim 10, wherein the window comprises a transparent electrode configured to pass the radiation toward the wafer chuck, and wherein the voltage bias causes a potential difference between the wafer chuck and the transparent electrode of the window.

13. The deposition system of claim 7, wherein the pump is configured to maintain the reduced pressure in the processing chamber while the window is changed and at least through a time when another precursor is introduced into the processing chamber.

14. A method of replacing a window of a deposition system, wherein the window is configured to transmit radiation from a radiation source to a wafer chuck configured to hold a semiconductor workpiece within a processing chamber, the method comprising:
with a pump, reducing a pressure of the processing chamber; and
with a robotic mechanism, replacing the window while the pump maintains the reduced pressure of the processing chamber.

15. The method of claim 14, further comprising, after the pressure of the processing chamber is reduced, and before the window is replaced, depositing a layer on the semiconductor workpiece.

16. The method of claim 14, further comprising introducing a precursor into the processing chamber after the window is replaced and with the pressure within the processing chamber still reduced.

17. The method of claim 1, wherein the window is replaced by a robotic system.

18. The method of claim 1, wherein the pressure within the processing chamber is reduced by a pump.

19. The method of claim 14, further comprising:
heating, by a heating element, the processing chamber to a first temperature for a first time period.

20. The method of claim 19, further comprising:
applying the radiation, through the window, from the radiation source to a top surface of the semiconductor workpiece to heat the semiconductor workpiece to a second temperature higher than the first temperature for a second time period shorter than the first time period.

* * * * *